(12) United States Patent
Wei

(10) Patent No.: US 7,157,956 B2
(45) Date of Patent: Jan. 2, 2007

(54) SWITCHED CAPACITOR INPUT CIRCUIT AND METHOD THEREFOR

(75) Inventor: Derrick Chunkai Wei, Austin, TX (US)

(73) Assignee: Silicon Laboratories, Inc., Austin, TX (US)

(*) Notice: Subject to any disclaimer, the term of this patent is extended or adjusted under 35 U.S.C. 154(b) by 68 days.

(21) Appl. No.: 11/004,387

(22) Filed: Dec. 3, 2004

(65) Prior Publication Data

US 2006/0119412 A1    Jun. 8, 2006

(51) Int. Cl.
*G06G 7/19* (2006.01)
*G11C 7/19* (2006.01)

(52) U.S. Cl. .......................... 327/337; 327/91
(58) Field of Classification Search ................. 327/91, 327/93–96, 390, 554
See application file for complete search history.

(56) References Cited

U.S. PATENT DOCUMENTS

| 4,574,250 | A | 3/1986 | Senderowicz |
| 4,647,865 | A | 3/1987 | Westwick |
| 5,351,050 | A | 9/1994 | Thompson et al. |
| 5,359,294 | A | 10/1994 | Ganger et al. |
| 5,461,381 | A | 10/1995 | Seaberg |
| 6,570,411 | B1* | 5/2003 | Bardsley et al. ............. 327/94 |
| 6,630,868 | B1 | 10/2003 | Perrott et al. |
| 6,859,159 | B1* | 2/2005 | Michalski ..................... 341/172 |
| 6,962,436 | B1* | 11/2005 | Holloway et al. ........... 374/170 |
| 6,975,103 | B1* | 12/2005 | Blom ........................ 324/99 D |

* cited by examiner

Primary Examiner—My-Trang Nu Ton
(74) Attorney, Agent, or Firm—Larson Newman Abel Polansky & White LLP

(57) ABSTRACT

A switched capacitor input circuit (200) includes an input buffer (210), a switched capacitor sampler circuit (220), and an integrator (250). The input buffer (210) has an input terminal for receiving an input voltage, and an output terminal. The switched capacitor sampler circuit (220) has an input terminal coupled to the output terminal of the input buffer (210), and an output terminal. The switched capacitor sampler circuit (220) includes a capacitor (222) and stores a charge proportional a voltage at the output terminal of the input buffer (210) in the capacitor (222) during a sample period, and transfers the charge from the capacitor (222) to the output terminal thereof during a transfer period subsequent to the sample period in a plurality of charge portions corresponding to a like plurality of phases of the transfer period. The integrator (250) has an input terminal coupled to the output terminal of the switched capacitor sampler circuit, and an output terminal for providing an output voltage signal.

20 Claims, 7 Drawing Sheets

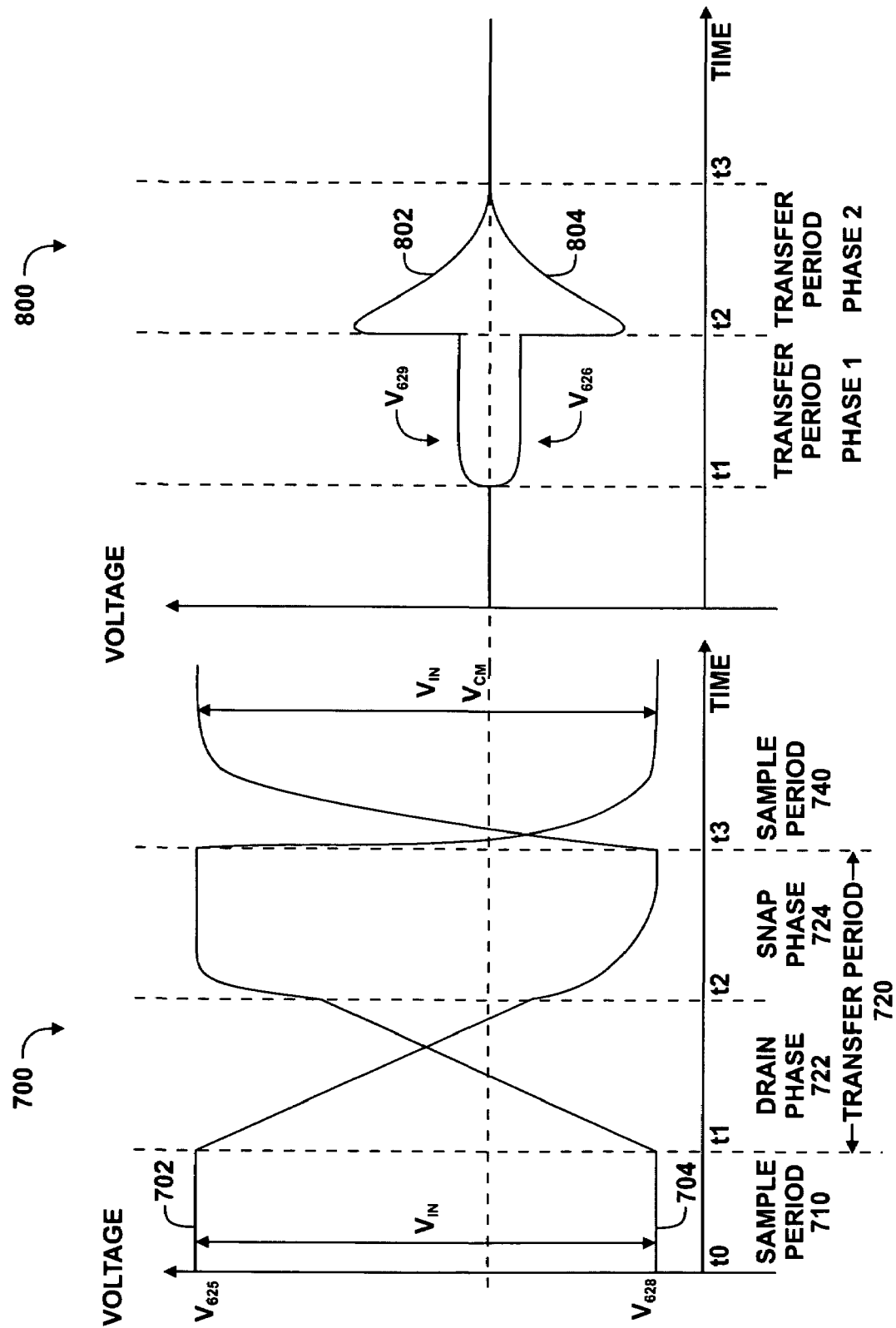

SWITCHED CAPACITOR INPUT CIRCUIT AND METHOD THEREFOR

CROSS REFERENCE TO RELATED, COPENDING APPLICATION

Related subject matter is found in a copending patent application entitled "Switched Capacitor Sampler Circuit and Method Therefor," application Ser. No. 11/003,288, invented by Derrick Chunkai Wei, filed of even date herewith and assigned to the assignee hereof.

TECHNICAL FIELD

The present application generally relates to electrical circuits, and more particularly to switched capacitor circuits and input buffers using such switched capacitor circuits.

BACKGROUND

A phase locked loop (PLL) is a circuit that can be used to generate an output clock signal at a selectable output frequency from a reference clock signal at a lower frequency. A classical PLL includes a phase detector that detects a difference in phase between a reference clock signal and a divided down version of the output clock signal. The output clock signal is generated by a voltage controlled oscillator (VCO). The output of the phase detector is used to adjust the output clock frequency by generating an appropriate voltage at the input of the VCO. Many different PLLs are known in the prior art, including analog, digital, and mixed analog and digital PLLs.

In one common PLL design, the VCO exists as a separate integrated circuit and includes its own divider at the output of an oscillator to add greater flexibility in frequency selection. In such a single-chip VCO the value of the divider may be set in response an analog input control voltage for compatibility with various PLL designs. Such a VCO ideally provides perfectly linear frequency selection based on the control voltage. However in modern complementary metal-oxide-semiconductor (CMOS) integrated circuits, power supply voltages have been reduced as speed has increased and power consumption has been reduced. This reduction in power supply voltages has constricted the working headroom of known input buffers that receive the control voltage.

Known input buffers suffer from poor linearity when the input range is a significant fraction of the power supply voltage. One such input buffer is the so-called unity gain follower. The unity-gain follower includes an operational amplifier having a positive input terminal that receives the input voltage, and an output terminal connected to a negative input terminal that provides the output voltage. The unity-gain follower suffers from the drawback that when the input voltage is close the power supply voltage rails, the current source transistors in the amplifier start to come out of saturation, causing the output voltage to no longer be linearly related to the input voltage.

Another input buffer design uses a source follower transistor having a source connected to ground through a resistor divider. The output is taken from an interconnection point of two resistors and the output voltage may be attenuated to allow more headroom. This design has poor noise performance because the system noise will be amplified by the attenuation ratio. The bandwidth requirement is difficult to maintain when low current consumption is required. Furthermore this design cannot recognize signals that are close to ground.

What is needed, then, is an input buffer that is able to operate linearly with a large input voltage range relative to the power supply voltage without introducing other problems, yet can deliver the input signal to further circuitry.

BRIEF SUMMARY

In one form a switched capacitor input circuit includes an input buffer, a switched capacitor sampler circuit, and an integrator. The input buffer has an input terminal for receiving an input voltage, and an output terminal. The switched capacitor sampler circuit has an input terminal coupled to the output terminal of the input buffer, and an output terminal. The switched capacitor sampler circuit includes a capacitor and stores a charge proportional a voltage at the output terminal of the input buffer in the capacitor during a sample period, and transfers the charge from the capacitor to the output terminal thereof during a transfer period subsequent to the sample period. The switched capacitor sampler circuit transfers the charge in a plurality of charge portions corresponding to a like plurality of phases of the transfer period. The integrator has an input terminal coupled to the output terminal of the switched capacitor sampler circuit, and an output terminal for providing an output voltage signal.

In another form an input voltage signal is buffered to provide a buffered voltage signal. A charge proportional to the buffered voltage signal is stored in a capacitor. A second terminal of the capacitor is coupled to a node during a transfer period subsequent to the sample period. The charge is transferred from the capacitor to the node in a plurality of charge portions corresponding to a like plurality of phases of the transfer period. The charge is integrated to form an output voltage signal.

In yet another form a switched capacitor input circuit includes buffer means, a capacitor, storing means, transferring means, and integrator means. The buffer means buffers an input voltage to provide a buffered input voltage. The capacitor has first and second terminals. The storing means stores a charge on the capacitor representative of the buffered input voltage during a sample period. The transferring means transfers the charge from the capacitor to a node during a transfer period subsequent to the sample period in a plurality of charge portions corresponding to a like plurality of phases of the transfer period. The integrator means integrates a voltage on the node to provide an output voltage of the switched capacitor input circuit.

BRIEF DESCRIPTION OF THE DRAWINGS

The present invention will hereinafter be described in conjunction with the following drawing figures, wherein like numerals denote like elements, and:

FIG. 7 illustrates a timing diagram useful in understanding the switched capacitor input circuit of FIG. 6;

FIG. 8 illustrates another timing diagram useful in understanding the switched capacitor input circuit of FIG. 6;

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
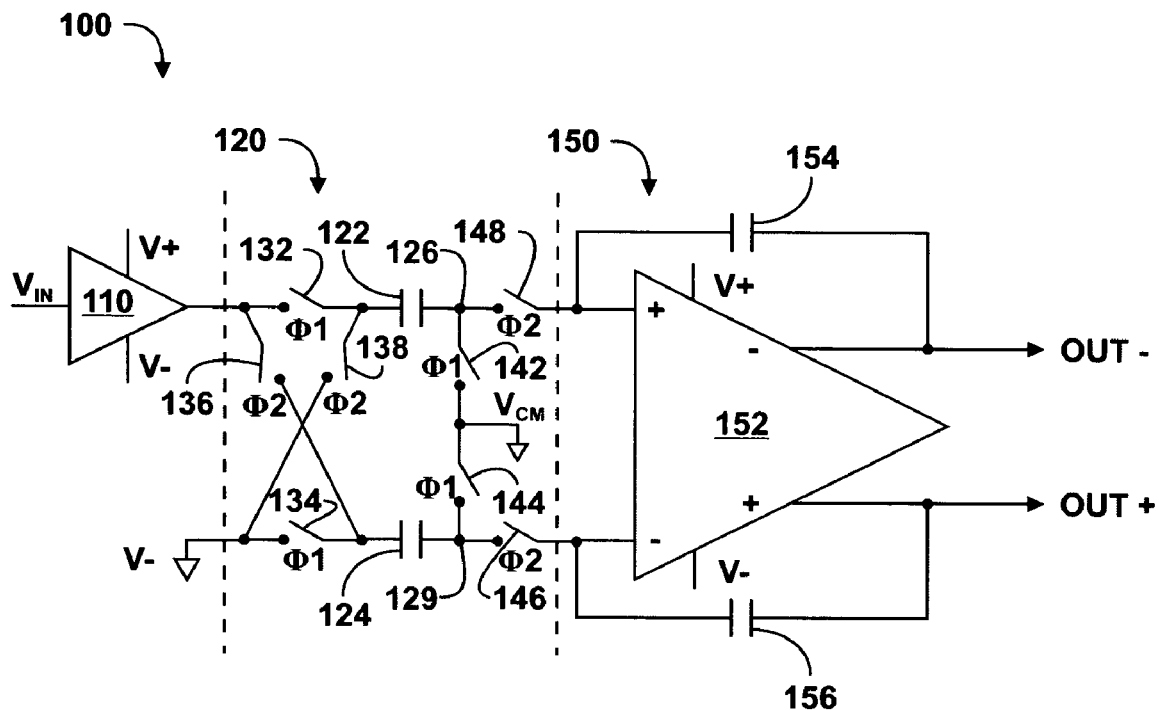
FIG. 1 illustrates in partial block diagram and partial schematic form a switched capacitor input circuit known in the prior art.

FIG. 1 illustrates in partial block diagram and partial schematic form a switched capacitor input circuit 100 known in the prior art. Switched capacitor input circuit 100 includes generally an input buffer 110, a switched capacitor sampler circuit 120, and an integrator 150. Input buffer 110 has an input terminal for receiving an input voltage labeled "$V_{IN}$", and an output terminal, and is powered from a positive power supply voltage terminal ("rail") labeled "V+" and a negative power supply voltage rail labeled "V−".

Switched capacitor sampler circuit 120 includes a capacitor 122, a capacitor 124, and switches 132, 134, 136, 138, 142, 144, 146, and 148. Each of capacitors 122 and 124 has first and second terminals. Switch 132 has a first terminal connected to the output terminal of input buffer 110, and a second terminal connected to the first terminal of capacitor 122, and is closed in response to a clock signal labeled "Φ1". Switch 134 has a first terminal connected to V−, and a second terminal connected to the first terminal of capacitor 124, and is closed in response to signal Φ1. Switch 136 has a first terminal connected to the output terminal of input buffer 110, and a second terminal connected to the first terminal of capacitor 124, and is closed in response to a signal labeled "Φ2". Switch 138 has a first terminal connected to V−, and a second terminal connected to the first terminal of capacitor 122, and is closed in response to signal Φ2. Switch 142 has a first terminal connected to the second terminal of capacitor 122 at a node 126, and a second terminal connected to a common mode voltage terminal labeled "$V_{CM}$", and is closed in response to signal Φ1. Switch 144 has a first terminal connected to node 129, a second terminal connected to $V_{CM}$, and is closed in response to signal Φ1. Switch 146 has a first terminal connected to node 129, and a second terminal, and is closed in response to signal Φ2. Switch 148 has a first terminal connected to node 126, and a second terminal, and is closed in response to signal Φ2.

Integrator 150 includes an operational amplifier 152 and capacitors 154 and 156. Operational amplifier 152 has a positive input terminal connected to the second terminal of switch 148, a negative input terminal connected to the second terminal of switch 146, and positive and negative output terminals for respectively providing signals labeled "OUT+" and "OUT−". Capacitor 154 has a first terminal connected to the positive input terminal of operational amplifier 154, and a second terminal connected to the negative output terminal of operational amplifier 152. Capacitor 156 has a first terminal connected to the input terminal of operational amplifier 154, and a second terminal connected to the positive output terminal (OUT+) of operational amplifier 152. Operational amplifier 152 is also powered from positive power supply voltage rail V+ and negative power supply voltage rail V−.

In operation, switched capacitor input circuit 100 provides a differential output voltage (OUT+ and OUT−) responsive to input voltage $V_{IN}$. Switched capacitor input circuit 100 has three cascaded stages: input buffer 110, switched capacitor sampler circuit 120, and integrator 150. Each of the three stages encounters significant performance problems when input signal $V_{IN}$ is near the upper rail (V+) or the lower rail (V−), restricting the input voltage range to value much less than the difference between the power supply voltage rails.

Input buffer 110 receives a single-ended signal $V_{IN}$ on its input terminal and provides an output signal $V_{IN}$ corresponding thereto. However, when input signal $V_{IN}$ is near one of the power supply voltage rails (V+ or V−) buffer 110 is unable to provide an output signal proportional to the input signal because its transistors have come out of saturation and the transfer characteristic becomes nonlinear. When using modern low voltage complimentary metal oxide semiconductor (CMOS) technology, for example, when an input signal is within about 0.5 volts of either supply voltage (V+ or V−), a CMOS amplifier starts to function in a non-linear fashion due to degraded gain, and input buffer 110 fails to provide an accurate output voltage.

These non-linearities can reduce the useable input voltage range by as much as 1 volt. If the power supply voltage is only 1.8 volts, then the useable signal range at the input may be as low as 0.8 volts.

Switched capacitor sampler circuit 120 also has significant problems receiving relatively large input voltages. In switched capacitor sampler circuit 120, switches 132, 134, 142, and 144 close during a sample period, placing a charge across each of capacitors 122 and 124. Thereafter switches 132, 134, 142, and 144 open and switches 136, 138, 146, and 148 close during a transfer period to transfer the charges from capacitors 122 and 124 to capacitors 154 and 156, respectively. When switch 138 closes during the transfer period, the second terminal of capacitor 122 is rapidly pumped down to a voltage below V− by an amount approximately equal to the voltage stored across capacitor 122 during the sample period. With a large input voltage, the parasitic PN junctions within the transistors in the switches will become forward biased causing the charge to be dissipated into the substrate. Furthermore this sudden forward biasing of the parasitic diodes may also cause the device to latch up.

Figure 2:
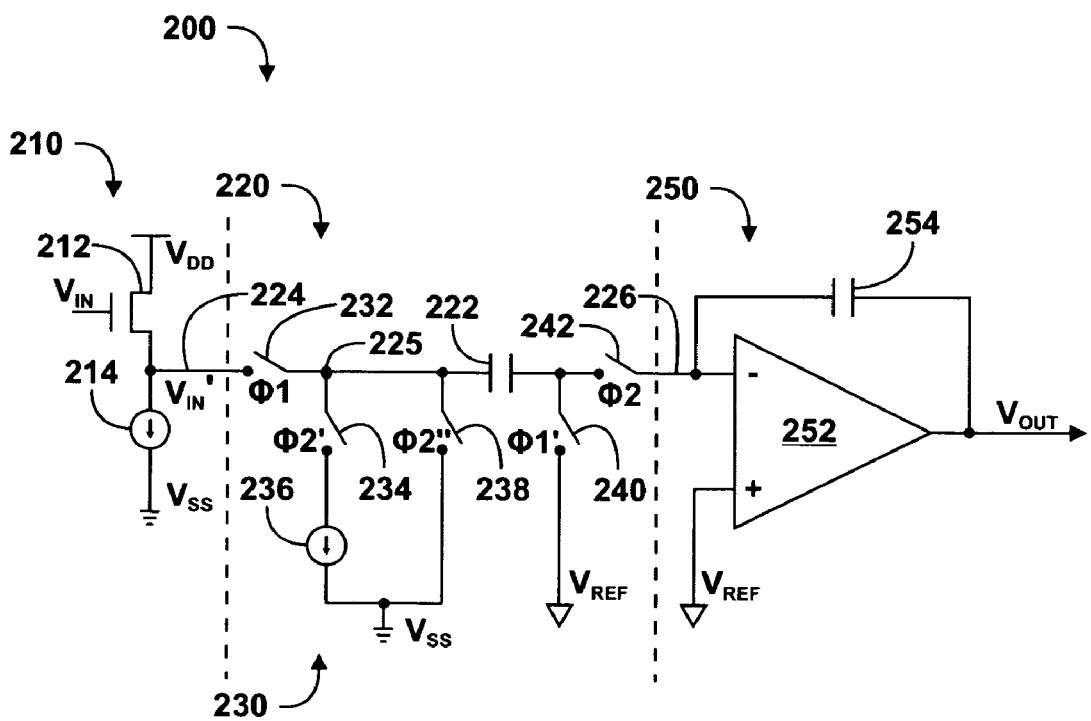
FIG. 2 illustrates in partial block diagram and partial schematic form a single-ended switched capacitor input circuit according to one embodiment of the present invention.

FIG. 2 illustrates in partial block diagram and partial schematic form a switched capacitor input circuit 200 according to one embodiment of the present invention. FIG. 2 illustrates a single-ended switched capacitor input circuit, but a differential switched capacitor input circuit will be described with reference to FIG. 6 below.

Switched capacitor input circuit 200 includes generally an input buffer 210, a switched capacitor sampler circuit 220, and an integrator 250. Input buffer 210 includes an intrinsic MOS transistor 212, and a current source 214. Transistor 212 has a first source/drain terminal connected to a power supply voltage terminal labeled "$V_{DD}$", a gate for receiving an input voltage labeled "$V_{IN}$", and a second source/drain terminal connected to a node 224. $V_{DD}$ is a more-positive power supply voltage terminal having a nominal voltage of about 1.8 volts. Current source 214 has a first terminal connected to the second source/drain terminal of transistor 212, and a second terminal connected to a power supply voltage terminal labeled "$V_{SS}$". $V_{SS}$ is a ground power supply voltage terminal having a nominal voltage of about 0 volts.

Switched capacitor sampler circuit 220 includes generally a capacitor 222 and a switching circuit 230. Capacitor 222 has a first terminal connected to a node 225, and a second terminal. Switching circuit 230 is connected to the first and second terminals of capacitor 222 and includes switches 232 and 234, a current source 236, and switches 238, 240, and 242. Switch 232 has a first terminal connected to node 224, and a second terminal connected to node 225, and is closed in response to signal Φ1. Switch 234 has a first terminal connected to the second terminal of switch 232 at node 225, and a second terminal, and is closed in response to signal Φ2. Current source 236 has a first terminal connected to the second terminal of switch 234, and a second terminal connected to $V_{SS}$. Switch 238 has a first terminal connected to the second terminal of switch 232 at node 225, and a second terminal connected to $V_{SS}$, and is closed in response to a clock signal labeled "Φ2'". Switch 240 has a first terminal connected to the second terminal of capacitor 222, and a second terminal connected to a reference voltage terminal labeled "$V_{REF}$", and is closed in response to a clock signal labeled "Φ1'". $V_{REF}$ is a reference voltage generally having a nominal voltage midway between $V_{DD}$ and $V_{SS}$ but in the illustrated embodiment is close to the minimum operating voltage of operational amplifier 252. Switch 242 has a first terminal connected to the second terminal of capacitor 222, and a second terminal connected to a node 226, and is closed in response to a clock signal labeled "Φ2".

Integrator 250 includes an operational amplifier 252 and a capacitor 254. Operational amplifier 252 has a positive input terminal connected to $V_{REF}$, a negative input terminal connected to the second terminal of switch 242 at node 226, and an output terminal for providing an output signal labeled "$V_{OUT}$". Capacitor 254 has a first terminal connected to the negative input terminal of operational amplifier 252, and a second terminal connected to the output terminal of operational amplifier 252.

In operation, input buffer 210 receives an analog voltage $V_{IN}$ and buffers it to form a buffered input voltage $V_{IN}'$. Input buffer 210 provides a high input impedance and a low output impedance. As illustrated in FIG. 2, transistor 212 is an intrinsic transistor, also referred to variously as a native or natural transistor, which is biased utilizing a current source 214. An intrinsic transistor is characterized as not having any additional doping besides that intrinsically present in the substrate (or well). An intrinsic transistor can be fabricated such that it has a small threshold voltage around zero volts. Signal $V_{IN}'$ follows $V_{IN}$ for values of $V_{IN}$ from about $V_{DD}$ to about $V_{SS}$ since the threshold of transistor 212 is low and close to zero. Thus, if $V_{IN}$ is equal to $V_{DD}$ (the input signal voltage equals the supply voltage), then the voltage at node 224 is also close to $V_{DD}$. Likewise, current source 214 is designed to ensure that when $V_{IN}$ is close to $V_{SS}$, the voltage at node 224 falls to about $V_{SS}$. Thus input buffer 210 provides a linear output voltage at node 224 over a wide range of input signals, from about $V_{DD}$ to about $V_{SS}$.

Switching circuit 230 is characterized as having two periods, known as a sample period and a transfer period. During the sample period, switches 232 and 240 are closed, and switches 234, 238, and 242 are open. Thus a charge corresponding to $V_{IN}'$ is stored in capacitor 222. During the transfer period, switches 232 and 240 are opened, switch 242 closes, and the charge stored in capacitor 222 is transferred to integrator 250. However the charge is transferred in two charge portions during two corresponding phases of the transfer period. During the first phase, known as the "drain" phase, switch 234 closes. The second terminal of switch 234 is connected to $V_{SS}$ through current source 236, which limits the rate of charge transfer to a predetermined maximum rate corresponding to the current of current source 236. This predetermined maximum rate is chosen to ensure that the voltage at the second terminal of capacitor 222 is never pumped so low that the parasitic diodes associated with the transistors in switches 240 and 242 become forward biased. At some point the voltage at node 225 becomes so low that current source 236 starts to come out of saturation, slowing the rate of charge transfer below the predetermined maximum rate established by current source 236. However during the second phase of the transfer period, known as the "snap" phase, switch 234 opens, and switch 238 closes to quickly drive the first terminal of capacitor 222 to $V_{SS}$, effectively "snapping" it to $V_{SS}$.

In integrator 250 operational amplifier 252 has a transconductance characteristic, but capacitor 254 converts the output current signal into a corresponding voltage signal $V_{OUT}$. $V_{OUT}$ is a highly linear representation of $V_{IN}$, but can have a smaller voltage range through an appropriate ratio between the capacitances of capacitors 222 and 254. Thus switched capacitor input circuit 200 allows $V_{OUT}$ to be processed with additional circuitry without voltage headroom problems.

Figure 3:
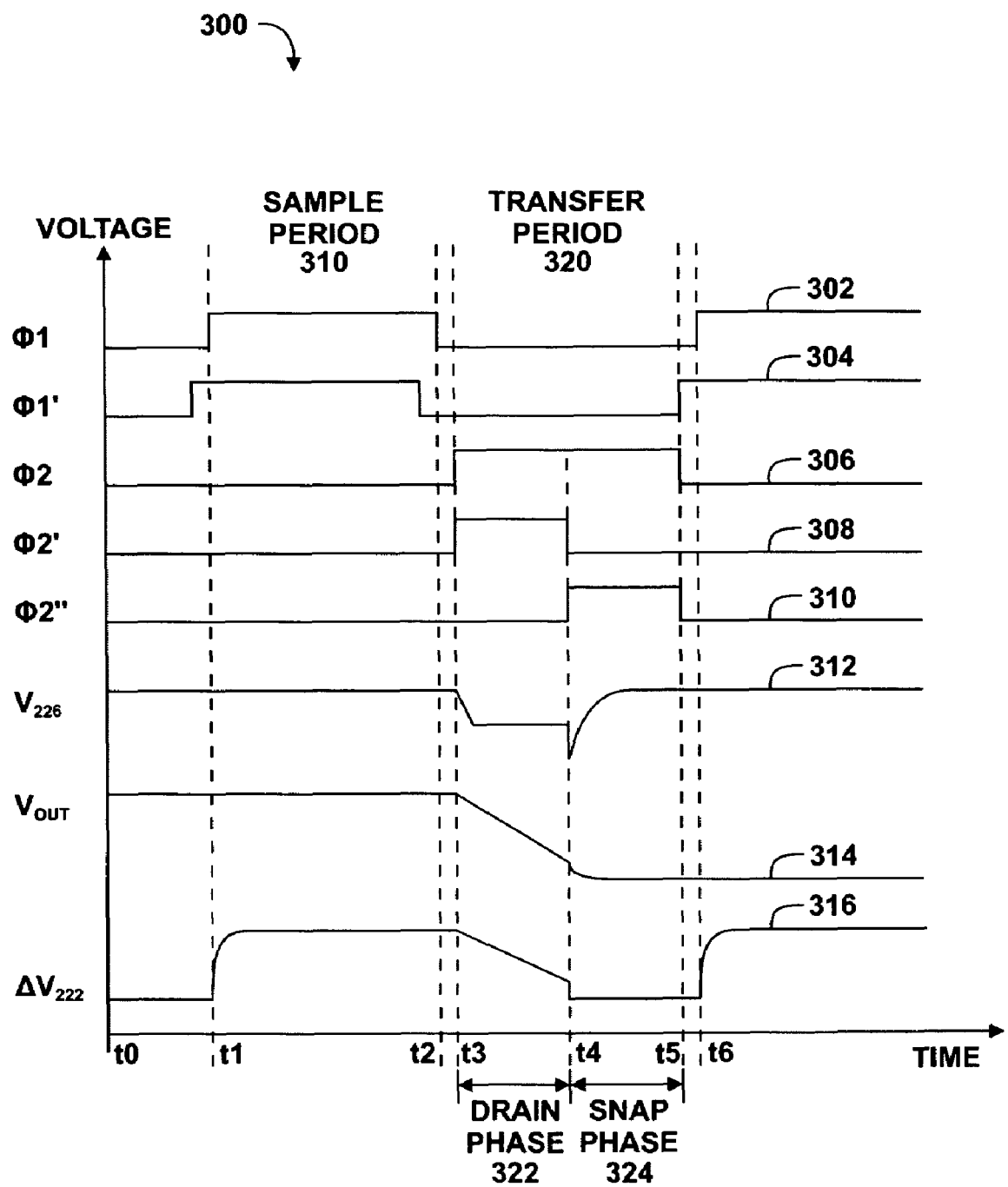
FIG. 3 illustrates a timing diagram useful in understanding the switched capacitor input circuit of FIG. 2.

The operation of switched capacitor input circuit 200 can be better understood with reference to FIG. 3, which illustrates a timing diagram 300 useful in understanding switched capacitor input circuit 220 of FIG. 2. In FIG. 3 the horizontal axis represents time and the vertical axis represents voltages of various signals. Clock signals φ1, φ1', φ2, φ2', and φ2" are illustrated by waveforms 302, 304, 306, 308, and 310, respectively. As illustrated clock signals are active and close the switches that they supply at a logic high voltage, are inactive and open switches that they supply at a logic low voltage. However it should be apparent that negative logic may be used as well.

A SAMPLE PERIOD 310 occurs between times t1 and t2, during which switches 242, 234, and 238 are open, as determined by signals φ2, φ2', and φ2" each having logic low levels. Signal φ1' goes to a logic high level a short time before signal φ1, causing switch 240 to close shortly before switch 232 closes. When switch 232 closes, voltage $V_{IN}'$ at node 224 is transferred to node 225 and capacitor 222 charges to a value representative of voltage $V_{IN}'$, as illustrated by waveform 316 of FIG. 3. Capacitor 222 stores a charge proportional to the voltage as defined by the equation Q=CV, wherein Q represents the stored charge, C represents the capacitance of capacitor 222, and V represents the voltage across capacitor 222, namely $V_{IN}'$. Near the end of SAMPLE PERIOD 310, switch 240 opens, and switch 232 opens a short time later.

During TRANSFER PERIOD 320 between times t3 and t5, signal φ2 closes causing switch 242 to connect the second terminal of capacitor 222 to node 226 at the input of integrator 250. During a first phase of TRANSFER PERIOD 320 between times t3 and t4, known as the DRAIN PHASE 322, signal φ2' closes switch 234, transferring a portion of the charge of capacitor 222 to node 226 at a predetermined maximum rate determined by the current of current source 236. Assuming $V_{IN}'$ is approximately equal to $V_{DD}$, $V_{OUT}$ falls at a fixed rate throughout DRAIN PHASE 322. Since capacitor 222 resists an abrupt change in voltage across its terminals, the voltage at node 226 drops below $V_{SS}$ but not so far below $V_{SS}$ to forward bias parasitic PN diodes associated with switches 240 and 242.

The charge transfer rate slows below the maximum rate if the voltage at node 225 becomes so low that the MOS transistor used in current source 236 starts to come out of saturation. However during a second phase of the TRANSFER PERIOD 320 between times t4 and t5 known as SNAP PHASE 324, switch 234 is opened and switch 238 is closed, "snapping" the remaining charge to $V_{SS}$. Switch 238 "snaps" or shorts the input terminal of capacitor 222 to $V_{SS}$ to quickly transfer any remaining charge on capacitor 222 to capacitor 254 at node 226. Switching circuit 230 and the timing of the transfer period are chosen such that, for $V_{IN}'$ equal to about $V_{DD}$, the remaining charge during the snap phase does not cause $V_{226}$ to drop so low as to forward bias any parasitic PN diode.

Figure 4:
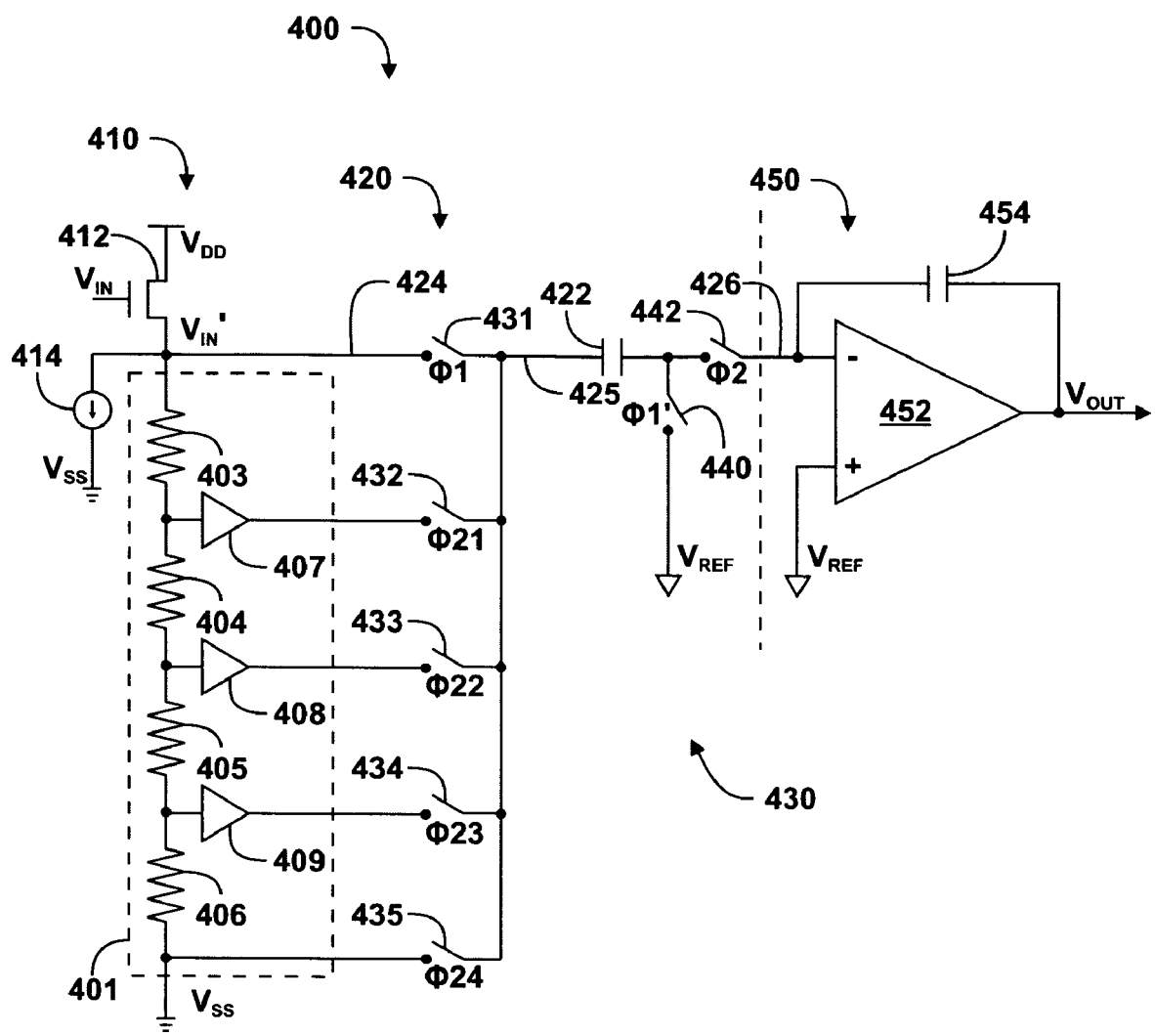
FIG. 4 illustrates in partial block diagram and partial schematic form a switched capacitor input circuit according to another embodiment.

FIG. 4 illustrates in partial block diagram and partial schematic form a switched capacitor input circuit 400 according to another embodiment of the present invention. Switched capacitor input circuit 400 includes generally an input buffer 410, a voltage developing network 401, a switched capacitor sampler circuit 420, and an integrator 450. Input buffer 410 includes an intrinsic transistor 412, and a current source 414. Transistor 412 has a first source/drain terminal connected to $V_{DD}$, a gate, and a second source/drain terminal connected to a node 424. Current source 414 has a first terminal connected to the second source/drain terminal of transistor 412, and a second terminal connected to $V_{SS}$. Voltage developing network 401 includes resistors 403, 404, 405, and 406, and unity-gain buffers 407, 408, and 409. Resistor 403 has a first terminal connected to the second source/drain terminal of transistor 412, and a second terminal. Resistor 404 has a first terminal connected to the second terminal of resistor 403, and a second terminal. Resistor 405 has a first terminal connected to the second terminal of resistor 404, and a second terminal. Resistor 406 has a first terminal connected to the second terminal of resistor 405, and a second terminal connected to $V_{SS}$. Buffer 407 has an input terminal connected to the second terminal of resistor 403, and an output terminal. Buffer 408 has an input terminal connected to the second terminal of resistor 404, and an output terminal. Buffer 409 has an input terminal connected to the second terminal of resistor 405, and an output terminal.

Switched capacitor sampler circuit 420 includes generally a capacitor 422 and a switching circuit 430. Capacitor 422 has a first terminal connected to a node 425, and a second terminal. Switching circuit 430 includes switches 431, 432, 433, 434, 435, 440, and 442. Switch 431 has a first terminal connected to node 424, and a second terminal connected to the first terminal of capacitor 422, and is closed in response to signal φ1. Switch 432 has a first terminal connected to the output terminal of buffer 407, and an output terminal, and is closed in response to a signal labeled "φ21". Switch 433 has a first terminal connected to the output terminal of buffer 408, and a second terminal connected to the output terminal of switch 432, and is closed in response to a signal labeled "φ22". Switch 434 has a first terminal connected to the output terminal of buffer 409, and a second terminal connected to the output terminal of switch 432, and is closed in response to a signal labeled "φ23". Switch 435 has a first terminal connected to $V_{SS}$, and a second terminal connected to the output terminal of switch 432, and is closed in response to a signal labeled "φ24". Switch 440 has a first terminal connected to the second terminal of capacitor 422, and a second terminal connected to $V_{REF}$, and is closed in response to signal φ1'. Switch 442 has a first terminal connected to the second terminal of capacitor 422, and a second terminal, and a second terminal connected to a node 426, and is closed in response to signal φ2.

Integrator 450 includes an operational amplifier 452 and a capacitor 454. Operational amplifier 450 has a positive input terminal connected to $V_{REF}$, a negative input terminal connected to node 426, and an output terminal for providing voltage $V_{OUT}$. Capacitor 454 has a first terminal connected to the negative input terminal of operational amplifier 452, and a second terminal connected to the output terminal of operational amplifier 452.

In operation, switched capacitor input circuit 400 transfers the charge stored across capacitor 422 to capacitor 454 connected to terminal 426 in a plurality of charge portions corresponding to a like plurality of phases of the transfer period. However instead of draining the charge during a first phase at a rate limited to a predetermined maximum rate and then snapping any additional charge during a second phase, switched capacitor input circuit 400 snaps the voltage at the first terminal of capacitor 422 to at least one intermediate voltage between $V_{IN}'$ and $V_{SS}$. This technique could be used with just a single intermediate voltage, but as shown in FIG. 4 voltage developing network 401 uses three intermediate voltages. The voltage steps are chosen to ensure that the voltage at the second terminal of capacitor 222 is never pumped so low that the parasitic diodes associated with the transistors in switches 440 and 442 become forward biased.

Figure 5:
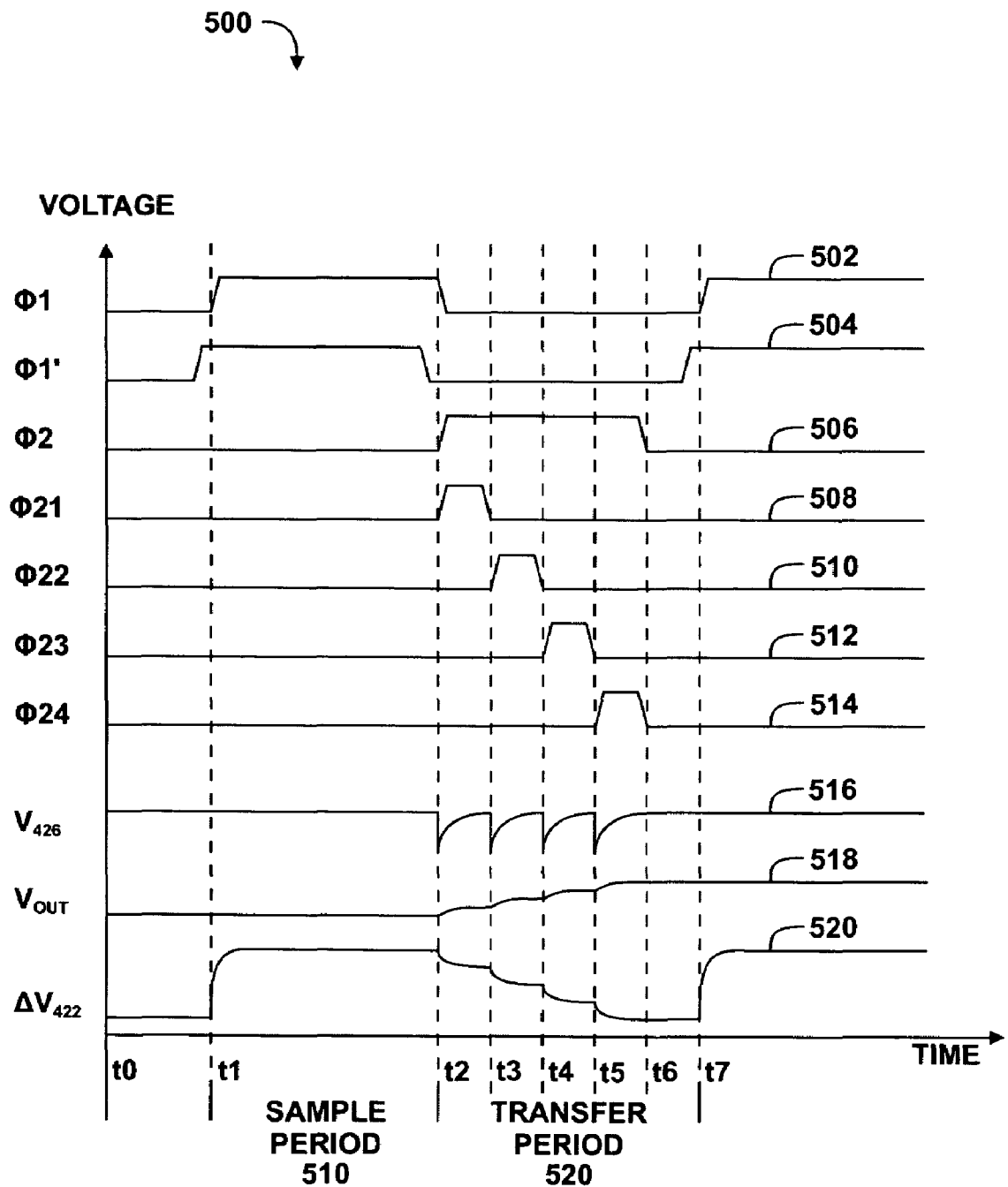
FIG. 5 illustrates a timing diagram useful in understanding the switched capacitor input circuit of FIG. 4.

Reference is now made to FIG. 5, which illustrates a timing diagram 500 useful in understanding switched capacitor sampler circuit 420 of FIG. 4. In FIG. 5 clock signals φ1, φ1', φ2, φ21, φ22, φ23, and φ24 are illustrated by waveforms 502, 504, 506, 508, 510, 512, and 514 respectively. Now considering FIGS. 4 and 5 together, the switching during a SAMPLE PERIOD 510 is substantially similar to that explained in FIG. 2. However, the multiphase charge transfer during a TRANSFER PERIOD 520 is realized utilizing multiple voltage reduction "steps" instead of a drain phase followed by a snap phase.

SAMPLE PERIOD 510 occurs between times t1 and t2. When SAMPLE PERIOD 510 commences, switches 432, 433, 434 and 435 are open as shown by clock signals φ21, φ22, φ23, and φ24 and waveforms 508, 510, 512, and 514 respectively. After switch 440 closes in response to clock signal φ1', switch 431 closes in response to clock signal φ1. When switch 431 closes, the voltage at node 424, $V_{IN}'$, is transferred to node 425 and capacitor 422 charges to a value corresponding to the voltage at $V_{IN}'$ as illustrated by waveform 520 in FIG. 5. Near the end of SAMPLE PERIOD 510 around time t2, switch 440 opens, and switch 431 subsequently opens as illustrated by clock signals φ1', and φ1 and waveforms 504 and 502 respectively.

During a TRANSFER PERIOD 520 occurring between times t2 and t6, switches 442 and 432 close around time t2 in response to clock signals φ2 and φ21, respectively. The charge retained by capacitor 422 is transferred to node 426 that forms the input of integrator 450 in a series of steps, as illustrated by waveform 516 in FIG. 5. When switch 432 closes, capacitor 422 discharges by an amount determined by the fractional voltage provided by the different stages of voltage developing network 401. Buffers 407, 408, and 409 isolate $V_{IN}'$ from transient voltages that may occur from switching between $V_{IN}'$ and capacitor 422.

Voltage developing network 401 divides input voltage $V_{IN}'$ into intermediate voltages using resistors 403, 404, 405, and 406. As shown in FIG. 4, voltage developing network 401 divides $V_{IN}$ into three intermediate voltages (¼ $V_{IN}$, ½

$V_{IN}$, and ¾ $V_{IN}$) by using equal valued resistors 403, 404, 405, and 406. Switched capacitor input circuit 400 is able to tolerate a large input voltage relative to the power supply voltage by limiting the maximum instantaneously voltage change at node 426 to ¼ $V_{IN}'$. In an alternative embodiment voltage developing network 401 may form these intermediate voltages as unequal fractions of the signal voltage ($V_{IN}'$).

Referring to FIG. 5, clock signals 508–514 become active during TRANSFER PERIOD 520 to close switches 432–435 in succession marked by times t2, t3, t4, and t5, discharging capacitor 422 in a series of smaller steps. Signal $V_{426}$ falls below ground but by a relatively small amount during each phase of the multiphase charge transfer period. This amount is small enough to prevent parasitic PN diodes from becoming forward biased. Waveform 518 depicts $V_{OUT}$ during both SAMPLE PERIOD 510 and TRANSFER PERIOD 520. Note that while switched capacitor input circuit 400 breaks TRANSFER PERIOD 520 into four phases, in other embodiments the transfer period can be divided into as many phases as desired.

Figure 6:
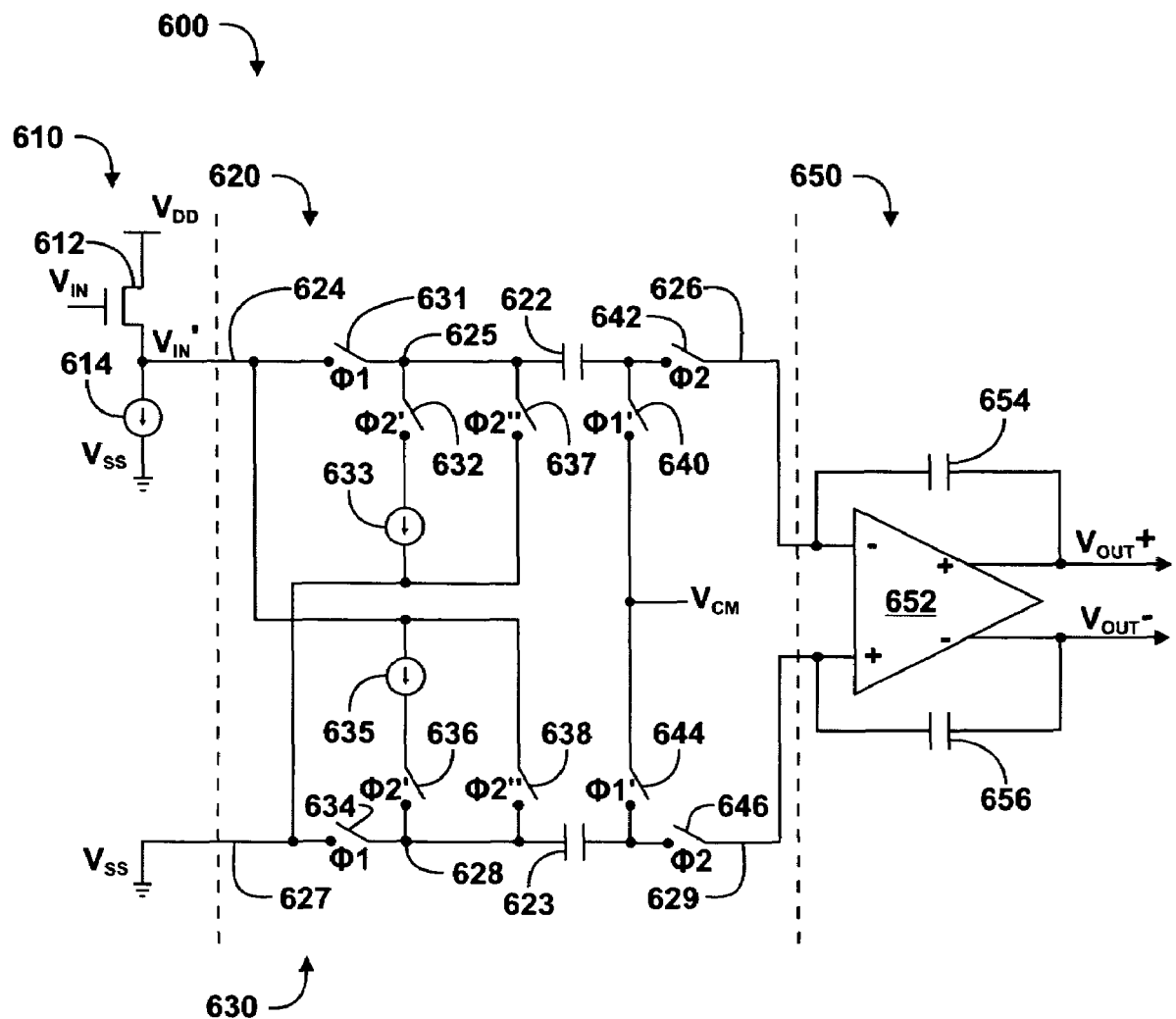
FIG. 6 illustrates in partial block diagram and partial schematic form a differential switched capacitor input circuit according to yet another embodiment of the present invention.

FIG. 6 illustrates in partial block diagram and partial schematic form a differential switched capacitor input circuit 600 according to yet another embodiment of the present invention. The differential circuit depicted has similar operational characteristics as the single-ended configuration of FIGS. 2 and 4. However, differential switched capacitor input circuit 600 provides better signal range and noise performance than the single-ended configurations.

Switched capacitor input circuit 600 includes generally an input buffer 610, a switched capacitor sampler circuit 620, and an integrator 650. Input buffer 610 includes an intrinsic MOS transistor 612 and a current source 614. Transistor 212 has a first source/drain terminal connected to $V_{DD}$, a gate for receiving $V_{IN}$, and a second source/drain terminal connected to a node 624. Current source 614 has a first terminal connected to the second source/drain terminal of transistor 612, and a second terminal connected to $V_{SS}$.

Switched capacitor sampler circuit 620 includes generally a capacitor 622, a capacitor 623, and a switching circuit 630. Capacitor 622 has a first terminal connected to a node 625, and a second terminal. Capacitor 623 has a first terminal connected to a node 628, and a second terminal. Switching circuit 630 is connected to nodes 624, 626, 627, and 629, and to the first and second terminals of capacitors 622 and 623, and includes switches 631 and 632, a current source 633, a switch 634, a current source 635, and switches 632, 636, 637, 638, 640, 644, 642, and 644.

Switch 631 has a first terminal connected to the output terminal of input buffer 610 at node 624, and a second terminal connected to the first terminal of capacitor 622, and is closed in response to signal ϕ1. Switch 632 has a first terminal connected to the second terminal of switch 631, and a second terminal, and is closed in response to signal ϕ2'. Current source 633 has a first terminal connected to the second terminal of switch 632, and a second terminal connected to $V_{SS}$. Switch 634 has a first terminal connected to $V_{SS}$ at node 627, and a second terminal connected to the first terminal of capacitor 623. Current source 635 has a first terminal connected to node 624, and a second terminal. Switch 636 has a first terminal connected to the second terminal of current source 635, and a second terminal connected to the second terminal of switch 634, and is closed in response to signal ϕ2'. Switch 637 has a first terminal connected to the second terminal of switch 631, and a second terminal connected to node 627, and is closed in response to signal ϕ2". Switch 637 has a first terminal connected to node 624, and a second terminal connected the first terminal of capacitor 623 at node 628, and is closed in response to signal ϕ2".

Switch 640 has a first terminal connected to the second terminal of capacitor 622, and a second terminal connected to $V_{CM}$, and is closed in response to signal ϕ1'. Switch 642 has a first terminal connected to the second terminal of capacitor 622, and a second terminal connected to a node 626, and is closed in response to signal ϕ2. Switch 644 has a first terminal connected to $V_{CM}$, and a second terminal connected to the second terminal of capacitor 623, and is closed in response to signal ϕ1'. Switch 646 has a first terminal connected to the second terminal of capacitor 623, and a second terminal connected to a node 629, and is closed in response to signal ϕ2.

Integrator 650 includes an operational amplifier 652 and capacitors 654 and 656. Operational amplifier 652 has a positive input terminal connected to node 629, a negative input terminal connected to node 626, a positive output terminal for providing a signal labeled "$V_{OUT}+$", and a negative output terminal for providing signal "$V_{OUT}-$". Capacitor 654 has a first terminal connected to the negative input terminal of operational amplifier 652, and a second terminal connected to the positive output terminal of operational amplifier 652. Capacitor 656 has a first terminal connected to the positive input terminal of operational amplifier 652, and a second terminal connected to the negative output terminal of operational amplifier 652.

In operation, switched capacitor input circuit 600 is a differential version of switched capacitor input circuit 200 of FIG. 2. Switched capacitor sampler 620 samples a differential input voltage between two input terminals 624 and 627 and transfers charge proportional thereto to output terminals 626 and 629. However instead of storing a charge in a single capacitor proportional to an input voltage referenced to a fixed voltage such as ground, switched capacitor input circuit 600 stores two charges in capacitors 622 and 623 proportional to each respective input voltage referenced to a common mode voltage $V_{CM}$. These charges are transferred to integrator 650 using a transfer period having drain and snap phases, in a manner similar to that described above with reference to FIG. 2. Integrator 650 then converts the charge into a corresponding differential output voltage. Note that since the input terminal 624 receives a single-ended voltage $V_{IN}'$ and terminal 627 is connected to $V_{SS}$, switched capacitor input circuit 600 also operates as a single-ended to differential converter. However switched capacitor sampler 620 could be used in a fully differential design as well. For example, input buffer 610 may be replaced by a differential input buffer connected to both node 624 and 627 to deliver a fully differential input signal to switched capacitor sampler 620.

FIG. 7 illustrates a timing diagram 700 of waveforms useful in understanding switched capacitor input circuit 600 of FIG. 6. In timing diagram 700, the horizontal axis represents time and the vertical axis represents voltage. Timing diagram 700 includes a first waveform 702 representing the voltage on node 625, and a second waveform 704 representing the voltage on node 628. Now considering FIGS. 6 and 7 together, during a first SAMPLE PERIOD 710 between a time labeled "t0" and a subsequent time labeled "t1", switches 631 and 634 close, driving voltage $V_{625}$ to about $V_{in}'$ and voltage $V_{628}$ to about $V_{SS}$. Around time t1 switches 631 and 634 open, and switches 640 and 644 close, charging capacitors 622 and 623 with their respective input voltages. These charges are transferred to integrator 650 during a subsequent TRANSFER PERIOD 720. During a DRAIN PHASE 720 of transfer period 720, between a time labeled t1 and a time labeled "t2", voltages $V_{625}$ and $V_{628}$ are gradually driven toward voltages $V_{SS}$ and $V_{IN}'$ at rates limited by current sources 633 and 635, respectively. During a SNAP PHASE 724, between time t2 and a time labeled "t3", remaining charge in capacitors 622 and 623 is snapped to $V_{SS}$ and $V_{IN}'$, respectively. The process repeats after time t3 in a new SAMPLE PERIOD 740.

FIG. 8 illustrates another timing diagram 800 of signals useful in understanding switched capacitor input circuit 600 of FIG. 6. In timing diagram 800, the horizontal axis represents time and the vertical axis represents voltage. Now considering FIGS. 6 and 8 together, a first waveform 802 represents the voltage on node 626, and a second waveform 804 represents the voltage on node 629. Times t1, t2, and t3 correspond to like time points in FIG. 7. The interval between times t1 and t2 define DRAIN PHASE 720, and the interval between times t2 and t3 define SNAP PHASE 730. Voltages $V_{626}$ and $V_{629}$ begin at $V_{CM}$ before time t1. During DRAIN PHASE 720, voltage $V_{624}$ is driven quickly to a voltage above $V_{CM}$ by an amount determined by current source 633 and the ratio of capacitances between capacitors 622 and 654. Likewise during DRAIN PHASE 720, voltage $V_{629}$ is driven quickly to a voltage below $V_{CM}$ by an amount determined by current source 635 and the ratio of capacitances between capacitors 623 and 656.

Figure 9:
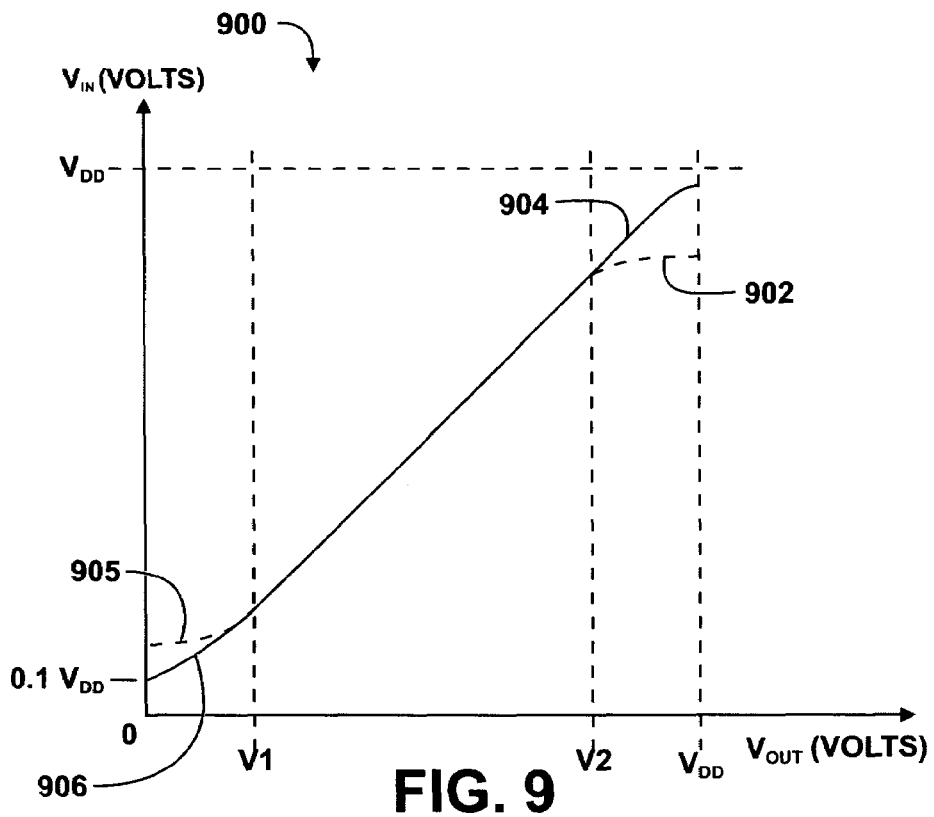
FIG. 9 illustrates a graph of the transfer characteristic of the switched capacitor circuit of FIG. 6.

FIG. 9 illustrates a graph 900 of the transfer function of switched capacitor sampler circuit 620 of FIG. 6. In FIG. 9, the horizontal axis represents input voltage and the vertical axis represents output voltage. In the illustrated embodiment, the power supply voltage is 1.8 volts so the horizontal axis extends from 0 volts to 1.8 volts and beyond. A first waveform 902 represents the actual transfer function of switched capacitor input circuit 600, and a second waveform 904 in the form of a dashed line represents an ideal, perfectly linear transfer function. Waveform 902 substantially coincides with waveform 904 over a wide range of input voltages between a first voltage labeled "V1" and a second voltage labeled "V2". By using intrinsic transistor 612 and limiting the discharge rates of capacitors 622 and 623, switched capacitor input circuit 600 is able to provide a substantially linear transfer function over about 90% of the possible input voltage range in a 1.8 volt system.

Figure 10:
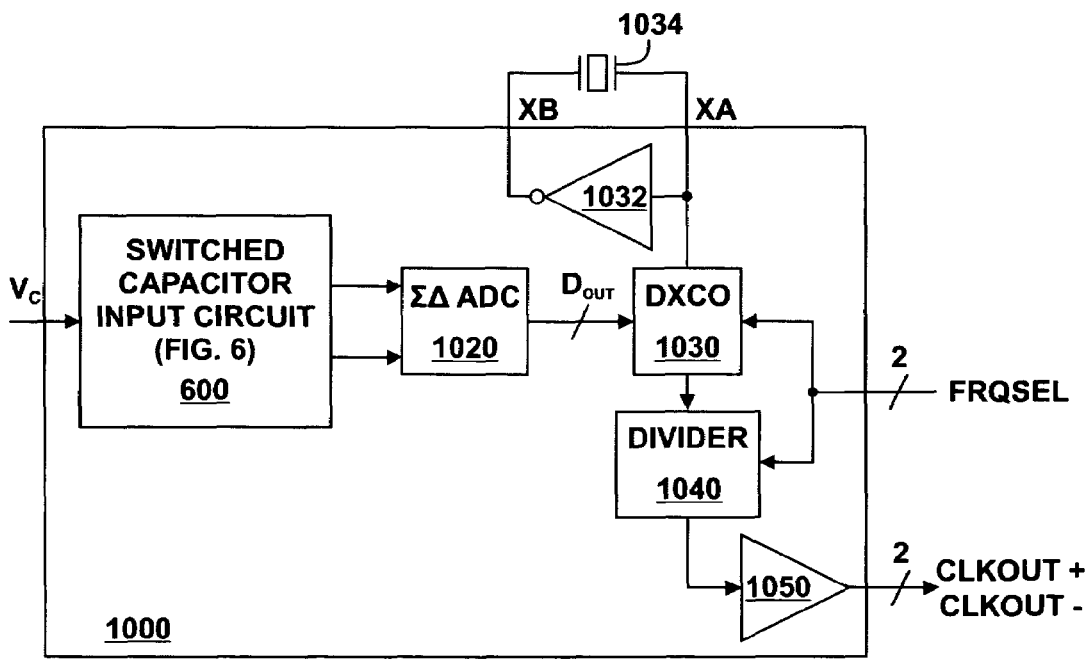
FIG. 10 illustrates in block diagram form a voltage-controlled oscillator using the switched capacitor input circuit of FIG. 6.

FIG. 10 illustrates in partial block diagram and partial schematic form a voltage-controlled oscillator (VCO) 1000 using switched capacitor input circuit 600 of FIG. 6. VCO 1000 can accept a wide range of input signals and produce a wide range of clock signal frequencies. Generally, an external crystal 1034 is connected to the voltage-controlled oscillator 1000 to create a base frequency. A ground-referred, single-ended control voltage $V_C$ is applied to the voltage controlled oscillator 1000 to control the frequency of a CLKOUT±signal.

VCO 1000 is implemented as an integrated circuit having several terminals of interest, including a control voltage input terminal labeled "$V_C$", a crystal input terminal labeled "XA", a crystal output terminal labeled "XB", a pair of control input terminals collectively labeled "FRQSEL", and a pair of clock output terminals labeled "CLKOUT+" and "CLKOUT−", respectively.

VCO 1000 includes generally switched capacitor input circuit 600, a sigma-delta (ΣΔ) analog-to-digital converter (ADC) 1020, a digitally controlled oscillator (DXCO) 1030, an inverting buffer 1032, a divider 1040, and a buffer 1050. Switched capacitor input circuit 600 has an input terminal for receiving control voltage $V_C$, and positive and negative output terminals for providing a differential voltage proportional to the input voltage. ADC 1020 has first and second input terminals respectively connected to the first and second output terminals of switched capacitor input circuit 600, and an output terminal for providing a multi-bit data signal labeled "$D_{OUT}$". DXCO 1030 has a clock input terminal connected to the XA input terminal, a data input terminal connected to the output terminal of ADC 1020, a control input terminal for receiving the FRQSEL control signals, and an output terminal. Buffer 1032 has an input terminal connected to input terminal XA, and an output terminal connected to output terminal XB. Crystal 1034 is an external crystal connected between the XA and XB terminals. Divider 1040 has an input terminal connected to the output terminal of DXCO 1030, a control input terminal connected to the FRQSEL input terminals, and an output terminal. Buffer 1050 has an input terminal connected to the output terminal of divider 1040, and output terminals connected to the CLKOUT+ and CLKOUT− output terminals.

Differential switched capacitor input circuit 600 receives input voltage $V_{IN}$ converts it linearly into a differential output voltage over a wide range of input voltages, from around the supply voltage ($V_{DD}$) to about 10% of $V_{DD}$. The nonlinearity encountered at low values of $V_{IN}$ is affected by the design of the current source. An MOS current source may be formed by biasing an N-channel current source transistor with an appropriate bias voltage, with an optional cascoded N-channel transistor to keep the drain voltage of the current source transistor constant. Alternatively a bipolar transistor whose base is supplied with an appropriate bias current may be used. In MOS integrated circuits the bipolar transistor may be conveniently formed as a lateral NPN transistor without the need for a complex bipolar-CMOS (BICMOS) process. Moreover if complementary intrinsic input circuit is added in parallel, the transfer characteristic can be linear over substantially the full range of $V_{IN}$ from $V_{SS}$ to $V_{DD}$.

ADC 1020 converts the differential voltage into a corresponding multi-bit digital value which is received as an input of data signal input to DXCO 1030. ADC 1020 can be implemented using any one of a variety of known sigma-delta architectures such as a second-order, one-bit modulator that uses a decimator at the output.

External crystal 1034 together with buffer 1032 forms an oscillator that provides a reference frequency for DXCO 1030.

DXCO 1030 and voltage divider 1040 receives the FRQSEL control signals to allow the user to select a frequency for output. In the illustrated embodiment, FRQSEL encodes one of four possible reference frequency and divider value combinations.

The clock signal is then sent to clock buffer 1050 and clock buffer 1050 provides an output clock signal in one of multiple output signal modes. The resulting output clock signal is linear over a very wide frequency range, from about 10 megahertz (MHz) to about 1.4 gigahertz (GHz).

The above-disclosed subject matter is to be considered illustrative, and not restrictive, and the appended claims are intended to cover all such modifications, enhancements, and other embodiments that fall within the true spirit and scope of the present invention. For example the switched capacitor sampler circuits disclosed above may be used in various other circuits. Furthermore it should be apparent that the differential technique used for the switched capacitor input circuit of FIG. 6 could be used to modify the circuit of FIG. 4 into a corresponding differential version. Thus, to the maximum extent allowed by law, the scope of the present invention is to be determined by the broadest permissible interpretation of the following claims and their equivalents, and shall not be restricted or limited by the foregoing detailed description.

What is claimed is:

1. A switched capacitor input circuit comprising:
   an input buffer having an input terminal for receiving an input voltage, and an output terminal;
   a switched capacitor sampler circuit having an input terminal coupled to said output terminal of said input buffer and an output terminal, said switched capacitor sampler circuit comprising a capacitor and storing a charge proportional a voltage at said output terminal of said input buffer in said capacitor during a sample period, and transferring said charge from said capacitor to said output terminal thereof during a transfer period subsequent to said sample period, wherein said switched capacitor sampler circuit transfers said charge in a plurality of charge portions corresponding to a like plurality of phases of said transfer period; and
   an integrator having an input terminal coupled to said output terminal of said switched capacitor sampler circuit, and an output terminal for providing an output voltage signal.

2. The switched capacitor input circuit of claim 1, wherein said input buffer comprises:
   a metal-oxide-semiconductor (MOS) transistor having a first source/drain terminal coupled to a power supply voltage terminal, a control electrode for receiving said input voltage, and a second source/drain terminal forming said output terminal of said input buffer; and
   a current source having a current terminal coupled to said second source/drain terminal of said MOS transistor for sinking a predetermined current therefrom.

3. The switched capacitor input circuit of claim 2, wherein said MOS transistor is characterized as being intrinsic.

4. The switched capacitor input circuit of claim 1, wherein said switched capacitor sampler circuit couples first and second terminals of said capacitor between said input terminal of said switched capacitor sampler circuit and a first reference voltage terminal, respectively, during said sample period, between a current source and said output terminal, respectively, during a first phase of said transfer period, and between a second reference voltage terminal and said output terminal, respectively, during a second phase of said transfer period.

5. The switched capacitor input circuit of claim 4, wherein said switched capacitor sampler circuit further comprises:
   a first switch having a first terminal for receiving said input voltage, and a second terminal coupled to said first terminal of said capacitor;
   a second switch having a first terminal coupled to said second terminal of said first switch, and a second terminal coupled to said current source;
   a third switch having a first terminal coupled to said second terminal of said first switch, and a second terminal coupled to said second reference voltage terminal;
   a fourth switch having a first terminal coupled to said second terminal of said capacitor, and a second terminal coupled to said first reference voltage terminal; and
   a fifth switch having a first terminal coupled to said second terminal of said capacitor, and a second terminal coupled to said output terminal.

6. The switched capacitor input circuit of claim 5, wherein said first and fourth switches are closed during said sample period, said second and fifth switches are closed during said first phase of said transfer period, and said third and fifth switches are closed during said second phase of said transfer period.

7. The switched capacitor input circuit of claim 6, wherein said fourth switch becomes open before said first switch becomes open at an end of said sample period.

8. The switched capacitor input circuit of claim 5, wherein said first through fifth switches are implemented using metal oxide semiconductor (MOS) transistors.

9. The switched capacitor input circuit of claim 4, wherein said first reference voltage terminal receives a common mode voltage, and said voltage terminal comprises a second input terminal of said switched capacitor sampler circuit.

10. The switched capacitor input circuit of claim 9, further comprising a second capacitor, wherein said switched capacitor sampler circuit further stores a second charge on said second capacitor proportional to a second input voltage during said sample period, and transfers said second charge from said second capacitor to a second output terminal during said transfer period, wherein said switched capacitor sampler circuit transfers said second charge in a plurality of charge portions corresponding to said like plurality of phases of said transfer period.

11. The switched capacitor input circuit of claim 1, wherein said switched capacitor sampler circuit couples first and second terminals of said capacitor between said input terminal and a reference voltage terminal, respectively, during said sample period and between a first predetermined portion of said input voltage and said output terminal, respectively, during a first phase of said transfer period, and between a power supply voltage terminal and said output terminal, respectively, during a last phase of said transfer period.

12. The switched capacitor input circuit of claim 11, wherein said switched capacitor sampler circuit further couples said first and second terminals of said capacitor between at least one other predetermined portion of said input voltage and said output terminal, respectively, during at least one other corresponding phase of said transfer period after said first phase and before said last phase.

13. A method for receiving an input voltage signal comprising the steps of:
   buffering the input voltage signal to provide a buffered voltage signal;
   storing a charge proportional to said buffered voltage signal in a capacitor during a sample period;
   coupling a second terminal of said capacitor to a node during a transfer period subsequent to said sample period;
   transferring said charge from said capacitor to said node in a plurality of charge portions corresponding to a like plurality of phases of said transfer period; and
   integrating said charge to form an output voltage.

14. The method of claim 13, wherein said step of transferring comprises the steps of:
   transferring a first portion of said charge to said node at a predetermined rate during a first phase of said transfer period; and
   transferring a remaining portion of said charge to said node during a second phase of said transfer period subsequent to said first phase of said transfer period.

15. The method of claim 13, wherein said step of transferring comprises the steps of:
   transferring a first predetermined portion of said charge to said node during a first phase of said transfer period; and transferring a remaining portion of said charge to said node during a last phase of said transfer period.

16. The method of claim 15, further comprising the step of:

transferring at least one additional predetermined portion of said charge to said node during at least one other corresponding phase of said transfer period after said first phase and before said last phase.

17. A switched capacitor input circuit comprising:

buffer means for buffering an input voltage to provide a buffered input voltage;

a capacitor having first and second terminals;

storing means for storing a charge on said capacitor representative of said buffered input voltage during a sample period;

transferring means for transferring said charge from said capacitor to a node during a transfer period subsequent to said sample period in a plurality of charge portions corresponding to a like plurality of phases of said transfer period; and integrator means for integrating a voltage on said node to provide an output voltage of the switched capacitor input circuit.

18. The switched capacitor input circuit of claim 17, wherein said transferring means comprises:

a drain circuit having a first terminal coupled to said first terminal of said capacitor, and a second terminal coupled to a reference voltage terminal, said drain circuit draining a portion of said charge from said first terminal of said capacitor at a predetermined maximum rate during a first phase of said transfer period; and a snap circuit having a first terminal coupled to said first terminal of said capacitor, and a second terminal coupled to said reference voltage terminal, said snap circuit snapping said first terminal of said capacitor to a reference voltage terminal to remove a remaining portion of said charge during a second phase of said transfer period subsequent to said first phase.

19. The switched capacitor input circuit of claim 17, wherein said transferring means is characterized as being a multi-phase switching circuit.

20. The switched capacitor input circuit of claim 19 wherein said transferring means comprises:

a voltage developing network having a first terminal for receiving said input voltage, a second terminal coupled to a reference voltage terminal, and an intermediate output terminal;

a first switch having a first terminal coupled to said intermediate output terminal of said voltage developing network, and a second terminal coupled to said first terminal of said capacitor; and a second switch having a first terminal coupled to said second terminal of said capacitor, and a second terminal coupled to said reference voltage terminal.

* * * * *

UNITED STATES PATENT AND TRADEMARK OFFICE
CERTIFICATE OF CORRECTION

PATENT NO. : 7,157,956 B2  Page 1 of 1
APPLICATION NO. : 11/004387
DATED : January 2, 2007
INVENTOR(S) : Derrick Chunkai Wei It is certified that error appears in the above-identified patent and that said Letters Patent is hereby corrected as shown below:

Col. 14, Line 12, please insert --second reference-- after "said" and before "voltage"

Signed and Sealed this

Eighth Day of April, 2008

JON W. DUDAS
*Director of the United States Patent and Trademark Office*